(12) United States Patent
Hartjes et al.

(10) Patent No.: US 12,436,361 B2
(45) Date of Patent: Oct. 7, 2025

(54) PROJECTION EXPOSURE APPARATUS FOR SEMICONDUCTOR LITHOGRAPHY

(71) Applicant: Carl Zeiss SMT GmbH, Oberkochen (DE)

(72) Inventors: Joachim Hartjes, Aalen (DE); Alexander Wolf, Essingen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 530 days.

(21) Appl. No.: 17/805,558

(22) Filed: Jun. 6, 2022

(65) Prior Publication Data

US 2022/0299733 A1 Sep. 22, 2022

Related U.S. Application Data

(63) Continuation of application No. PCT/EP2020/083370, filed on Nov. 25, 2020.

(30) Foreign Application Priority Data

Dec. 10, 2019 (DE) .......................... 102019219231.9

(51) Int. Cl.
*G02B 7/195* (2021.01)
*G02B 7/18* (2021.01)
*G03F 7/00* (2006.01)

(52) U.S. Cl.
CPC .......... *G02B 7/195* (2013.01); *G02B 7/1815* (2013.01); *G03F 7/70891* (2013.01)

(58) Field of Classification Search
CPC ... G02B 7/195; G02B 7/1815; G03F 7/70891; G03F 7/709; G03F 7/70883; G03F 7/2041

See application file for complete search history.

(56) References Cited

U.S. PATENT DOCUMENTS

| 8,632,194 B2 * | 1/2014 | Hauf ................. G05D 23/1919 359/845 |
| 2005/0099611 A1 * | 5/2005 | Sogard ................ G02B 7/1815 359/845 |

(Continued)

FOREIGN PATENT DOCUMENTS

| CN | 101859976 A | * | 10/2010 |
| CN | 104004888 A | * | 8/2014 |

(Continued)

OTHER PUBLICATIONS

Lee et al. "Gain Squaring in a Cr : Nd : GSGG Active-Mirror Amplifier Using a Cholesteric Liquid Crystal Mirror", IEEE Journal of Quantum Electronics, vol. 24, No. II, Nov. 1988.*

(Continued)

*Primary Examiner* — Edmond C Lau
(74) *Attorney, Agent, or Firm* — Fish & Richardson P.C.

(57) ABSTRACT

A projection exposure apparatus for semiconductor lithography includes a mirror and a temperature-regulating device for regulating temperature on the basis of radiation. The mirror includes at least one cutout. The temperature-regulating device includes a temperature-regulating body arranged without contact in the cutout of the mirror. The temperature-regulating body has a cavity. A fluid for temperature regulation of the temperature-regulating body is present in the cavity.

20 Claims, 4 Drawing Sheets

(56) References Cited

U.S. PATENT DOCUMENTS

| | | | |
|---|---|---|---|
| 2005/0128446 A1 | 6/2005 | Miyajima | |
| 2010/0200777 A1* | 8/2010 | Hauf | G02B 7/1815 |
| | | | 359/845 |
| 2014/0211187 A1* | 7/2014 | Hauf | G03F 7/70075 |
| | | | 359/848 |
| 2015/0103326 A1* | 4/2015 | Heintel | G03F 7/70825 |
| | | | 355/30 |
| 2016/0054662 A1* | 2/2016 | Wolf | G03F 7/70891 |
| | | | 355/52 |

FOREIGN PATENT DOCUMENTS

| | | | | |
|---|---|---|---|---|
| CN | 102428408 B | * | 11/2014 | G03F 7/70308 |
| CN | 108527800 A | * | 9/2018 | B29C 45/7312 |
| DE | 10 2017 217 266 A1 | | 3/2019 | |
| EP | 1376185 A2 | | 1/2004 | |
| EP | 0869592 B1 | * | 9/2004 | |
| JP | H03-011542 A | | 1/1991 | |
| WO | WO 2014/139896 A2 | | 9/2014 | |

OTHER PUBLICATIONS

John Merchant, "Infrared Temperature Measurement Theory and Application", Thermal Processing, p. 38-41.*
Taiwanese Office Action and Search Report, with translation thereof, for corresponding TW Appl No. 109142987, dated Jun. 27, 2024.
International Search Report and Written Opinion for corresponding PCT Appl No. PCT/EP2020/083370, mailed Mar. 9, 2021.
Satori et al., "Laser Cooling of Neutral Argon for Simulating the Storage of Antimatter," *Journal of Propulsion and Power*, NTRS-NASA Technical Reports Server, US, vol. 12, No. 5, Sep.-Oct. 1996, pp. 918-925.
German Office Action, with translation thereof, for corresponding DE Appl No. 102019219231.9, dated Jun. 25, 2020.
Office Action in Korean Appln. No. 10-2022-7022980, mailed on May 14, 2025, 13 pages (with English translation).

* cited by examiner

PROJECTION EXPOSURE APPARATUS FOR SEMICONDUCTOR LITHOGRAPHY

CROSS-REFERENCE TO RELATED APPLICATIONS

The present application is a continuation of, and claims benefit under 35 USC 120 to, international application PCT/EP2020/083370, filed Nov. 25, 2020, which claims benefit under 35 USC 119 of German Application No. 10 2019 219 231.9, filed Dec. 10, 2019. The entire disclosure of these applications are incorporated by reference herein.

FIELD

The disclosure relates to a projection exposure apparatus for semiconductor lithography.

BACKGROUND

Projection exposure apparatuses for semiconductor lithography are subject to relatively stringent performance expectations with respect to imaging quality in order to be able to produce the desired microscopically small structures with very few, if any, defects. In a lithography process or a microlithography process, an illumination system illuminates a photolithographic mask. The light passing through the mask or the light reflected by the mask is projected, via a projection optical unit, onto a substrate (e.g. a wafer) which is coated with a light-sensitive layer (photoresist) and fitted in the image plane of the projection optical unit in order to transfer the structure elements of the mask to the light-sensitive coating of the substrate. In general, the intensity of the light provided by the illumination system is increased with each new generation of projection exposure apparatuses, which results in a higher thermal load on the optical elements.

The temperature of the optical elements, embodied as mirrors, in EUV projection exposure apparatuses, that is to say in apparatuses which are operated with electromagnetic radiation having a wavelength of between 1 nm and 120 nm, for example at 13.5 nm, is usually regulated via water cooling. For this purpose, the mirrors can have cutouts through which temperature-regulated water flows and which can carry away the heat from the mirror. Water cooling can involve feed lines for the water are mechanically connected to the mirror and vibrations from outside can thereby be transferred to the mirror. In addition, the flow of the water itself can cause so-called flow-induced vibrations, which adverse influence the imaging quality.

The patent application WO2014/139896 A2 discloses a temperature-regulating device arranged without contact in a cutout of a mirror, wherein the temperature-regulating device comprises a cooling element and a heating element. In that case, the cutout is arranged perpendicular to the optical axis of the mirror. However, the combination of cooling and heating for controlling the heat flow is rather complex, which can affect the related infrastructure and production costs.

SUMMARY

The present disclosure seeks to provide an improved device.

The disclosure provides a projection exposure apparatus for semiconductor lithography that includes a mirror including at least one cutout and a temperature-regulating device for regulating temperature on the basis of radiation comprising a temperature-regulating body, which is arranged without contact in the cutout of the mirror. According to the disclosure, the temperature-regulating body has a cavity, wherein a fluid for temperature regulation of the temperature-regulating body is present in the cavity. Mechanical connections between the temperature-regulating body and the mirror are therefore not present, with the result that no vibrations can be transmitted. The temperature regulation by the fluid can be effected by convection, for example.

In some embodiments, at least one cutout of the mirror in which a temperature-regulating body is situated is arranged between two bar bodies. In this case, a bar body should be understood to mean a longitudinally extended, such as bar-shaped, body. In a simple case, the bar body is embodied as a parallelepipedal body having a considerably longer extent in one spatial direction than in the other two spatial directions, for example by a factor of greater than 3. Deviations from the parallelepipedal shape, such as a trapezium-shaped cross section, are also conceivable. In this case, the bar bodies are arranged on a baseplate of the mirror, wherein at least one mirror facet is arranged on that side of the bar bodies which faces away from the baseplate. Effective cooling of the top side of a facet mirror, the top side usually being subjected to great thermal loading, can be achieved in this way.

Furthermore, the cavity can include an inlet and an outlet for the fluid. As a result, the fluid for temperature regulation can flow through the cavity. The inlet and outlet can be arranged at a different structure from the carrying structure on which the mirrors are mounted. The two structures can be arranged in a manner decoupled from one another, which can make it possible to reduce transmission of vibrations via a possible common basic carrier.

In addition, a mechanism for cooling the fluid in the temperature-regulating body by laser irradiation can be present. In this case, the fluid, which can include rubidium and/or argon, for example, can be irradiated by a laser and cools down as a result. This effect is attributable to reducing the velocity of the atoms by suitable irradiation with laser radiation (photons) and has already been verified experimentally. The effect can be intensified by a coating on the inner side of the temperature-regulating body, wherein the coating is reflective in the wavelength range of the laser used. The reflectivity can have a value of greater than 90%.

Furthermore, the temperature-regulating body can be configured in such a way that its temperature is adjustable in a range of 20° Celsius to minus 70° Celsius. The arrangement of the temperature-regulating body in the cutout of the mirror without contact can have the result that, in contrast to cooling with mechanical contact, it is possible to set relatively large temperature differences between the temperature-regulating body and the mirror, without producing impermissible stresses in the material as a result of large temperature gradients.

In addition, the outer side of the temperature-regulating body directed towards the mirror material and/or the inner surface of the cutout can include a coating. For example, the coating can have an absorptivity of at least 50%, such as at least 80%, for example 90%, over a wavelength range of 6 µm to 20 µm. The spectral radiance of a body at 22° C. can have its maximum in the region of 9 µm and can be at a negligible level outside the range of 6 µm to 20 µm.

In some embodiments, the temperature-regulating body can be configured in such a way that its position and/or orientation are/is adjustable. It can be customary for the position and/or the orientation of the mirrors themselves also to be adjustable. The resultant changes in distance between temperature-regulating body and mirror can be compensated for by the adjustability of the position and/or orientation of the temperature-regulating body. Alternatively, the change in distance can also be used for controlling the heat flow besides the temperature of the temperature-regulating body.

Furthermore, the distance between the temperature-regulating body and the inner surfaces of the cutout can be detected by a sensor. On the basis of the detected distance, a deviation from a target distance can be determined and the temperature-regulating body can again be brought into the correct position and/or orientation.

For example, an open-loop and/or closed-loop control of the projection exposure apparatus can be configured in such a way that in the event of a predetermined minimum distance between the temperature-regulating body and the inner surface of the cutout being undershot, the temperature-regulating body is positioned and oriented in such a way that the minimum distance is re-established.

Furthermore, at least one sensor for detecting the temperature of the mirror can be present. In this case, the detection of the temperature at the surface can be of particular interest for the effect of the deformation of the surface, the deformation arising from a temperature difference, on the imaging properties. Frequently, however, for technical reasons, a temperature in the mirror is measured and the temperature at the mirror surface is determined with the aid of finite element models. The same model can also be used for controlling the temperature of the mirror.

In addition, at least one sensor for detecting the temperature of the temperature-regulating body can be present.

For example, an open-loop and/or closed-loop control for temperature regulation can be present and configured in such a way that the temperature of the temperature-regulating body is controlled on the basis of the detected temperature of the mirror and/or of the temperature-regulating body. The open-loop and/or closed-loop control can for example control the temperature of the temperature-regulating body to a predefined target temperature in a first control loop and the temperature of the mirror in a second control loop. A deviation of the mirror temperature can lead to an adaptation of the target temperature of the temperature-regulating body and thus to a deviation of the present actual temperature from the new target temperature. A deviation of the actual temperature of the temperature-regulating body can thus be caused by an actual temperature change of the actual temperature or by an adaptation of the target temperature that is determined by the super-ordinate control.

In some embodiments, the wavelength of used light employed by the projection exposure apparatus for imaging can be in the range of 1 nm to 120 nm, such as 13.5 nm.

Furthermore, the ambient conditions for the operation of the projection exposure apparatus can include a vacuum in the region of the optical elements.

BRIEF DESCRIPTION OF THE FIGURES

Exemplary embodiments and variants of the disclosure are explained in more detail below with reference to the drawing. In the figures.

EXEMPLARY EMBODIMENTS

Figure 1:
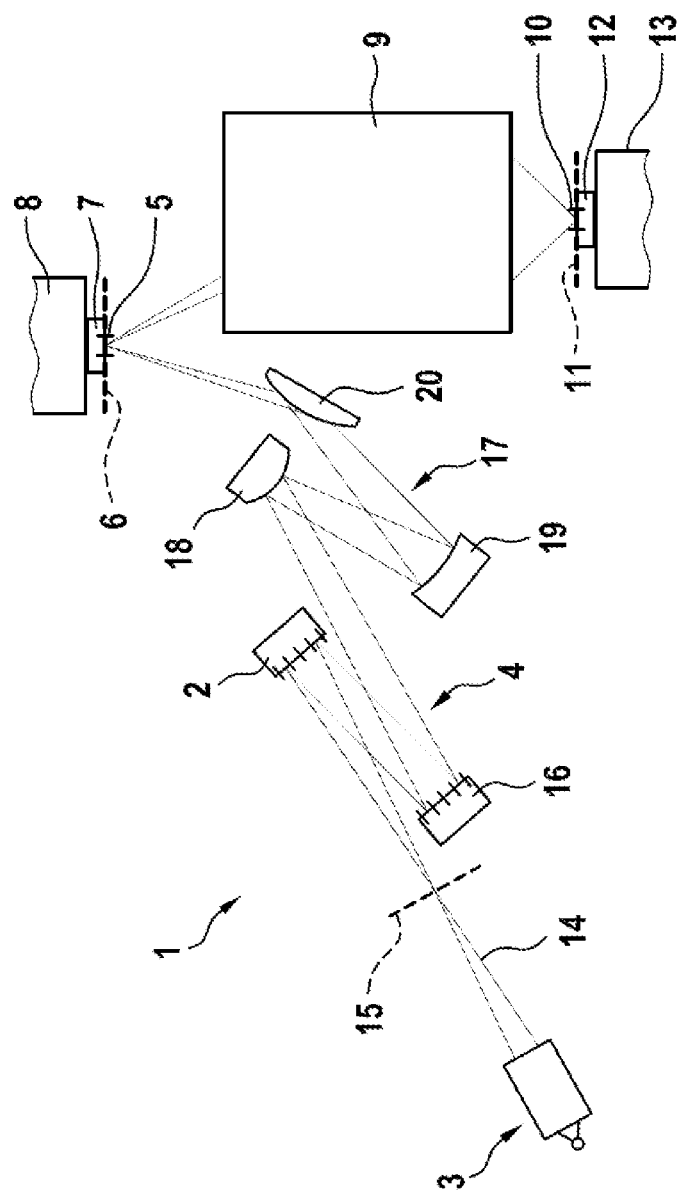
FIG. 1 shows a basic illustration of a projection exposure apparatus in which the disclosure can be implemented.

FIG. 1 shows by way of example the basic construction of a microlithographic EUV projection exposure apparatus 1 in which the disclosure can find application. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A merely schematically illustrated projection optical unit 9 serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly represented wafer holder 13. The light source 3 can emit used radiation in a wavelength range of, for example, between 1 nm and 120 nm.

The disclosure can likewise be used in a DUV apparatus, which is not illustrated. A DUV apparatus is set up in principle like the above-described EUV apparatus 1, wherein mirrors and lens elements can be used as optical elements in a DUV apparatus and the light source of a DUV apparatus emits used radiation in a wavelength range of 100 nm to 300 nm.

Figure 2:
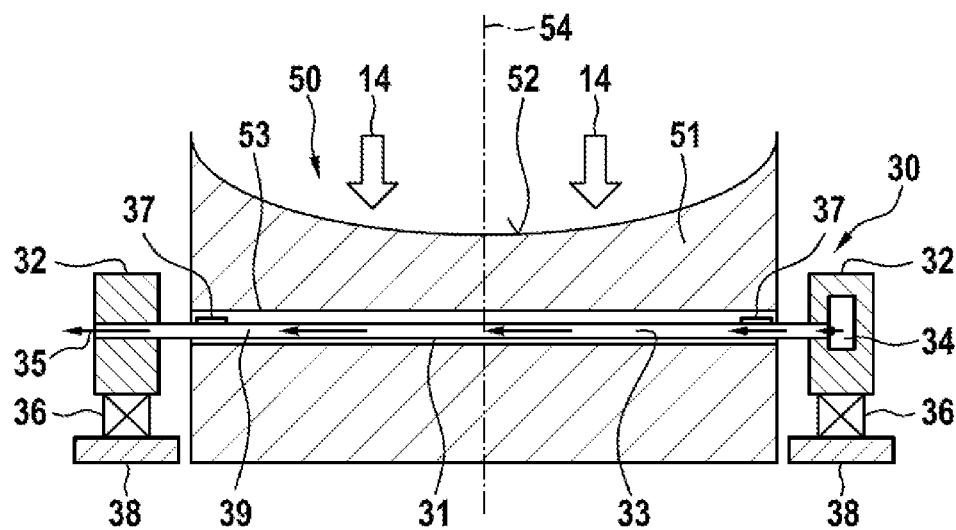
FIG. 2 shows an exemplary embodiment of the disclosure.

FIG. 2 shows an embodiment of the disclosure illustrating a schematic detail view of a mirror 50, which can correspond for example to a mirror 18 or 19 illustrated in FIG. 1. The mirror 50 comprises a mirror body 51 and an optical surface 52, which is heated by partial absorption of the EUV radiation 14. Furthermore, the mirror 50 comprises a cutout 53 extending perpendicular to the optical axis 54 of the mirror 50 through the entire mirror body 51. Depending on the shape of the optical surface 52 and the production methods used for the cutouts 53, the latter can also extend parallel to the optical surface 52. A temperature-regulating body 31 of a temperature-regulating device 30 is arranged in the cutout 53 in such a way that the temperature-regulating body 31 has no mechanical contact with the inner surfaces of the cutout 53 and is positioned in the latter at equidistant distances from the inner surfaces of the cutout 53. The temperature-regulating body 31 comprises a cavity 33, through which a fluid 39 flows. The cavity 33 is connected via an inlet 34 to a system (not illustrated) for conditioning the fluid 39, such as helium, for example, to a predetermined temperature, such as minus 70° Celsius, for example. Arranged on the opposite side of the mirror 30 is the outlet 35 of the cavity 33, which returns the fluid 39 to the system for conditioning. The inlet 34 and the outlet 35 can also be arranged on the same side of the mirror 50 and in this case the fluid 39 can be diverted at the opposite end of the temperature-regulating body 31, such that the cavity 33 comprises an outgoing portion and a return portion. The temperature-regulating body 31 is mounted in a receptacle 32 of the temperature-regulating device 30, which, by way of an actuator 36, is connected to a frame 38 of the projection exposure apparatus 1 illustrated in FIG. 1 and is thus mechanically decoupled visa vis the mirror 50. As a result, no vibrations can be transferred from the temperature-regulating device 30 to the mirror 50. The actuator 36 can move the temperature-regulating body 31 in such a way that the distance between the temperature-regulating body 31 and the cutout 53 remains constant, even in the case where the mirror 50 is moved in order to correct imaging aberrations. For the purpose of detecting the distance, a sensor 37 is arranged on the temperature-regulating body 31. Alternatively, the sensor 37 could also be arranged in the cutout 53 of the mirror 50. The signals detected are communicated to an open-loop and/or closed-loop control (not illustrated), which controls the actuator 36 on the basis of the sensor signals. The open-loop and/or closed-loop control also controls the flow rate and temperature of the fluid 39 in the temperature-regulating body 31. The sensors used for detecting the temperature of the temperature-regulating body 31 and of the mirror 50 are not illustrated for reasons of clarity.

Figure 3:
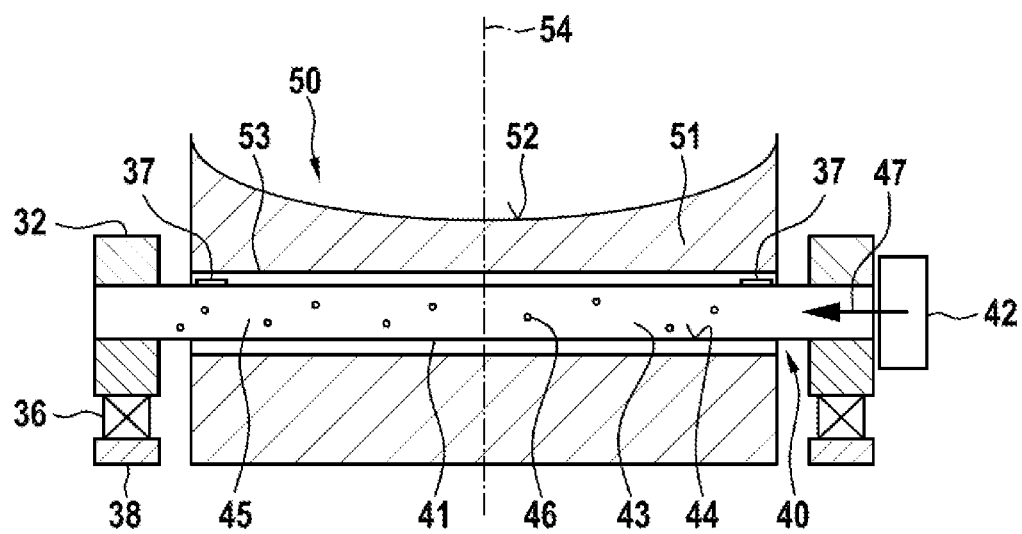
FIG. 3 shows an exemplary embodiment of the disclosure.

FIG. 3 shows an embodiment of the disclosure illustrating a mirror 50 having a cutout 53. The set-up is identical to the mirror 50 illustrated in FIG. 2 with the difference that the fluid 45 does not flow through the temperature-regulating body 41 of the temperature-regulating device 40. The fluid 45, which comprises rubidium and/or argon, for example, is arranged in a cavity 43 of the temperature-regulating body 41 and is irradiated by a laser 42, as a result of which it cools down. This effect is attributable to reducing the velocity of the atoms 46 by suitable irradiation with laser radiation 47 (photons) and has already been verified experimentally. The effect is intensified by a coating 44 on the inner side of the cavity 43, the coating being reflective in the wavelength range of the laser used. In this case, the reflectivity has a value of greater than 90%. The arrangement of the temperature-regulating body 41 in the cutout 53 of the mirror 50 and on the receptacles 32, which are movable by actuators 36 on the frame 38, and also the orientation of the cutout 53 with respect to the optical axis 54 and/or with respect to the optical surface 52 are identical to those described in FIG. 2 and are not repeated again here.

Figure 4:
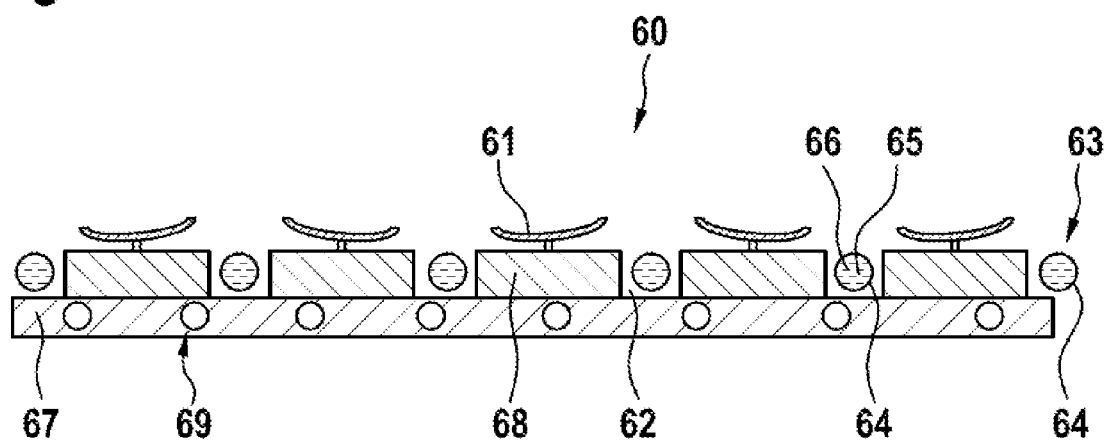
FIG. 4 shows an exemplary embodiment of the disclosure.

FIG. 4 shows an embodiment of the disclosure illustrating a mirror 60 having a plurality of mirror facets 61, such as, for example, a field facet mirror 2 or pupil facet mirror 16 described in FIG. 1. The mirror facets 61 are arranged on bar bodies 68 one behind another, that is to say into the plane of the drawing in the view illustrated in FIG. 4. The bar bodies 68 are arranged next to one another on a baseplate 67, which is cooled by a cooling device 69. For additional temperature regulation of the bar bodies 68, which are connected to the baseplate 67 by the side facing away from the mirror facets 61, a temperature-regulating device 63 regulates the temperature of the bar bodies 68. The temperature-regulating device comprises temperature-regulating bodies 64 arranged in cutouts 62 between the individual bar bodies 68 in such a way that temperature regulation of the bar bodies 68 without contact is brought about by way of radiation. For the purpose of temperature regulation, as described in FIG. 2, a fluid 66 can flow through a cavity 65 formed in the temperature-regulating body 64 or, as described in FIG. 3, rubidium (not illustrated) or argon (not illustrated) contained in the fluid 66 is irradiated by laser in order to realize laser cooling. In the first case, the cavity 65 is connected to an inlet and an outlet, which are not illustrated in the view shown. Other kinds of temperature regulation of the temperature-regulating body are also conceivable.

Figure 5:
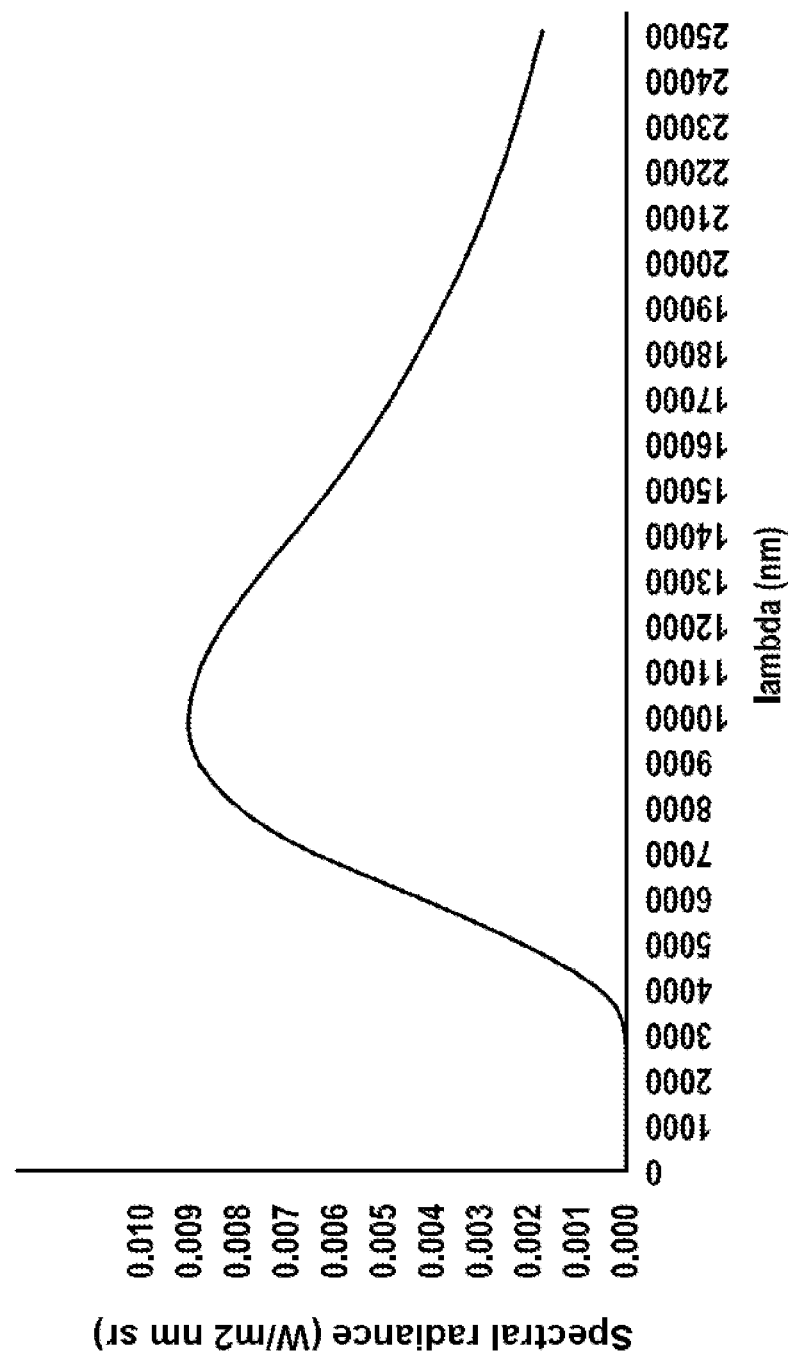
FIG. 5 shows a diagram of spectral radiance versus wavelength.

FIG. 5 shows a diagram in which spectral radiance (W/m² nmsr) is plotted against wavelength for the inner surface—illustrated in FIGS. 2 to 4—of the cutout 53 of the mirror 50 at a temperature of 22° Celsius. A maximum at which heat is emitted the most can be discerned at a wavelength of 9 μm. On the basis of this, the inner surfaces of the cutout 53 of the mirror 50 and the outer surfaces of the temperature-regulating body 50 are configured in such a way that they both respectively absorb relatively well at this wavelength and thereby ensure a sufficient cooling capacity.

LIST OF REFERENCE SIGNS

1 Projection exposure apparatus
2 Field facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate field focal plane
16 Pupil facet mirror
17 Assembly
18 Mirror
19 Mirror
20 Mirror
30 Temperature-regulating device
31 Temperature-regulating body
32 Receptacle
33 Cavity
34 Inlet
35 Outlet
36 Actuator
37 Sensor
38 Frame
39 H2, fluid
40 Temperature-regulating device
41 Temperature-regulating body
42 Laser
43 Cavity
44 Coating
45 Rubidium, fluid
46 Atoms
47 Laser radiation
50 Mirror
51 Mirror body
52 Optical surface
53 Cutout
54 Optical axis
60 Mirror
61 Mirror facet
62 Cutout
63 Temperature-regulating device
64 Temperature-regulating body
65 Cavity
66 Fluid
67 Baseplate 68 Bar body
69 Cooling device baseplate

What is claimed is:

1. An apparatus, comprising:
a mirror comprising a cutout;
a temperature-regulating body in the cutout of the mirror; and
a sensor configured to detect a distance between the temperature-regulating body and an inner surface of the cutout,
wherein:
the temperature-regulating body comprises a cavity configured to allow a fluid to flow therethrough to regulate a temperature of the temperature-regulating body;
the temperature-regulating body does not contact the cutout of the mirror; and
the apparatus is a semiconductor lithography projection exposure apparatus.

2. The apparatus of claim 1, wherein:
the mirror comprises a mirror facet, a baseplate, and two bar bodies supported by the baseplate;
the cutout is between the two bar bodies; and
one of the bar bodies is between the baseplate and the mirror facet.

3. The apparatus of claim 1, wherein the cavity comprises an inlet configured to allow the fluid into the cavity and an outlet configured to allow the fluid out of the cavity.

4. The apparatus of claim 1, further comprising a laser configured to cool the fluid when the fluid is in the cavity by irradiating the fluid with laser radiation.

5. The apparatus of claim 4, wherein a reflectivity of an inner surface of the cavity is at least 90% for the laser radiation.

6. The apparatus of claim 1, wherein the temperature-regulating body is configured so that, during use of the temperature-regulating body, a temperature of the temperature-regulating body is adjustable in a range of 20° C. to minus 70° C.

7. The apparatus of claim 1, further comprising a coating, wherein the coating is supported by an outer surface of the temperature-regulating body or the inner surface of the cutout.

8. The apparatus of claim 7, wherein the coating has an absorptivity of at least 50% over a wavelength range of 6 μm to 20 μm.

9. The apparatus of claim 1, wherein at least one of the following holds:
the temperature-regulating body has an adjustable position; and
the temperature-regulating body has an adjustable orientation.

10. The apparatus of claim 1, further comprising a control loop configured so that, when a distance between the temperature-regulating body and the inner surface of the cutout is less than a predetermined value, the temperature-regulating body is re-oriented and/or re-positioned so that the distance between the temperature-regulating body and the inner surface of the cutout is at least the predetermined value, wherein the control loop is an open-loop control and/or a closed-loop control.

11. The apparatus of claim 1, further comprising a further sensor, wherein the further sensor is configured to detect a temperature of the mirror.

12. The apparatus of claim 11, wherein the further sensor is configured to detect a temperature of the cavity.

13. The apparatus of claim 11, further comprising a controller configured to control a temperature of the cavity based of the detected temperature of the mirror.

14. The apparatus of claim 1, further comprising a further sensor, wherein the further sensor is configured to detect a temperature of the cavity.

15. The apparatus of claim 14, further comprising a controller configured to control a temperature of the cavity based of the detected temperature of the cavity.

16. The apparatus of claim 1, wherein the apparatus is configured to operate at a wavelength of used light a range of 1 nm to 120 nm.

17. The apparatus of claim 1, wherein the apparatus is configured so that, during use of the apparatus, the mirror is in a vacuum.

18. The apparatus of claim 1, wherein the apparatus comprises an illumination system and a projection optical unit, and the mirror is in the illumination system.

19. A system, comprising:
a mirror comprising cutout;
a temperature-regulating body in the cutout of the mirror; and
a sensor configured to detect a distance between the temperature-regulating body and an inner surface of the cutout,
wherein:
the temperature-regulating body comprises a cavity configured to allow a fluid to flow therethrough to regulate a temperature of the temperature-regulating body;
the temperature-regulating body does not contact the cutout of the mirror; and
the system is a semiconductor lithography illumination system.

20. The apparatus of claim 19, further comprising a control loop configured so that, when a distance between the temperature-regulating body and the inner surface of the cutout is less than a predetermined value, the temperature-regulating body is re-oriented and/or re-positioned so that the distance between the temperature-regulating body and the inner surface of the cutout is at least the predetermined value, wherein the control loop is an open-loop control and/or a closed-loop control.

* * * * *

UNITED STATES PATENT AND TRADEMARK OFFICE
CERTIFICATE OF CORRECTION

| | | |
|---|---|---|
| PATENT NO. | : 12,436,361 B2 | Page 1 of 1 |
| APPLICATION NO. | : 17/805558 | |
| DATED | : October 7, 2025 | |
| INVENTOR(S) | : Joachim Hartjes, Alexander Wolf and Toralf Gruner | |

It is certified that error appears in the above-identified patent and that said Letters Patent is hereby corrected as shown below:

In the Claims

Column 8, Line 46, in Claim 20, delete "apparatus" and insert -- system --.

Signed and Sealed this
Eighteenth Day of November, 2025

John A. Squires
*Director of the United States Patent and Trademark Office*